(12) United States Patent
Broyer

(10) Patent No.: US 9,719,858 B2
(45) Date of Patent: Aug. 1, 2017

(54) ADJUSTABLE PYROMETER MOUNT WITH REMOVABLE VIEWPORT MECHANISM

(71) Applicant: GTAT Corporation, Merrimack, NH (US)

(72) Inventor: David F. Broyer, Kingston, NH (US)

(73) Assignee: GTAT Corporation, Merrimack, NH (US)

( * ) Notice: Subject to any disclaimer, the term of this patent is extended or adjusted under 35 U.S.C. 154(b) by 199 days.

(21) Appl. No.: 14/488,495

(22) Filed: Sep. 17, 2014

(65) Prior Publication Data

US 2015/0153233 A1 Jun. 4, 2015

Related U.S. Application Data

(60) Provisional application No. 61/884,475, filed on Sep. 30, 2013.

(51) Int. Cl.
*G01J 5/02* (2006.01)
*B23P 6/00* (2006.01)
(Continued)

(52) U.S. Cl.
CPC ............. *G01J 5/042* (2013.01); *B23P 6/00* (2013.01); *F27D 21/0014* (2013.01);
(Continued)

(58) Field of Classification Search
CPC ............. F27D 21/0014; F27D 21/02; F27D 2021/023; G01K 1/14; G12B 9/08;
(Continued)

(56) References Cited

U.S. PATENT DOCUMENTS 889,352 A * 6/1908 Bold .................... G02B 25/002
359/808
1,547,142 A * 7/1925 Bausch ................ G02B 25/002
206/316.1
(Continued)

FOREIGN PATENT DOCUMENTS

JP 2009-244169 A 10/2009
KR 10-2001-0024045 A 3/2001

OTHER PUBLICATIONS

International Search Report dated Dec. 19, 2014 issued in connection with PCT/US2014/056059.

*Primary Examiner* — Christopher Besler
*Assistant Examiner* — Matthew P Travers
(74) *Attorney, Agent, or Firm* — Parker Ibrahim & Berg LLC; Stephen D. LeBarron

(57) ABSTRACT

According to the disclosed embodiments, an illustrative apparatus that is configured to attach to a viewport of a container comprises a first plate having a first aperture and an attached second plate having a second aperture substantially aligned to the first aperture. The first and second plates, when attached, define a cavity from an outer edge of the first and second plates to the substantially aligned apertures. A window containment arm is pivotally affixed to at least the first plate and configured to substantially fit and pivot into and out of the cavity, and a window contained within the window containment arm is positioned such that the window substantially aligns with the first and second apertures when the window containment arm is fully pivoted into the cavity, and such that the window is accessibly located outside of the cavity when the window containment arm is pivoted out of the cavity.

15 Claims, 14 Drawing Sheets

(51) Int. Cl.
  *F27D 21/00* (2006.01)
  *F27D 21/02* (2006.01)
  *G01J 5/04* (2006.01)
  *G01J 5/00* (2006.01)
  *C30B 35/00* (2006.01)

(52) U.S. Cl.
  CPC ............ *F27D 21/02* (2013.01); *G01J 5/0044* (2013.01); *G01J 5/0205* (2013.01); *G01J 5/026* (2013.01); *G01J 5/04* (2013.01); *G01J 5/043* (2013.01); *C30B 35/00* (2013.01); *Y10T 29/4973* (2015.01); *Y10T 29/49718* (2015.01); *Y10T 29/49723* (2015.01); *Y10T 29/53896* (2015.01)

(58) Field of Classification Search
  CPC ......... Y10T 29/49721; Y10T 29/49723; Y10T 29/4973; Y10T 29/53896; B23P 6/00; G02B 27/0006; G01J 1/0271; G01J 1/0403; G01J 1/0466; G01J 5/0037–5/004; G01J 5/0044; G01J 5/0205; G01J 5/04; G01J 5/042; G01J 5/043; G01J 5/045; G01J 5/048; G01J 5/0893
  USPC .............................. 374/208; 359/894; 356/43
  See application file for complete search history.

(56) References Cited

U.S. PATENT DOCUMENTS

| | | | | |
|---|---|---|---|---|
| 1,838,494 A * | 12/1931 | Neuwirth | ............. | G02B 25/002 359/808 |
| 1,976,672 A * | 10/1934 | Peet | ..................... | G01N 21/293 356/412 |
| 1,999,782 A * | 4/1935 | Rehm | ..................... | F23M 7/00 126/200 |
| 2,147,961 A * | 2/1939 | Albrecht | .................. | G01J 1/04 356/225 |
| 2,394,946 A * | 2/1946 | Stegeman | ............ | G02B 25/002 359/808 |
| 2,682,805 A * | 7/1954 | Tomasovic | ............. | A63H 37/00 15/250.01 |
| 2,926,658 A * | 3/1960 | Ligon | ................... | F23M 11/042 126/200 |
| 3,176,577 A * | 4/1965 | Frank | ................... | G01N 21/293 356/412 |
| 3,340,890 A * | 9/1967 | Raskhodoff | ............. | C23C 14/52 137/315.01 |
| 3,964,831 A * | 6/1976 | Frank | ..................... | G01N 21/29 356/246 |
| 4,530,660 A * | 7/1985 | O'Brien | .................. | F27D 21/02 110/173 C |
| 4,763,986 A * | 8/1988 | Sego | ...................... | G02B 25/02 356/30 |
| 4,799,787 A | 1/1989 | Mason | | |
| 4,840,474 A * | 6/1989 | Heft | .................... | G02B 23/2492 348/83 |
| 5,642,234 A * | 6/1997 | Altman | .................. | G02B 25/02 359/802 |
| 5,793,522 A * | 8/1998 | Brun | ...................... | G01J 5/041 359/350 |
| 6,313,960 B2 * | 11/2001 | Marquiss | ................. | G02B 5/22 359/889 |
| 8,550,664 B1 * | 10/2013 | Nguyen | ................. | G02B 7/006 362/282 |
| 2004/0240518 A1 | 12/2004 | Memoli et al. | | |
| 2010/0014152 A1 * | 1/2010 | Robinson | .................. | G01J 5/02 359/350 |
| 2011/0243182 A1 | 10/2011 | Tetzlaff et al. | | |

* cited by examiner

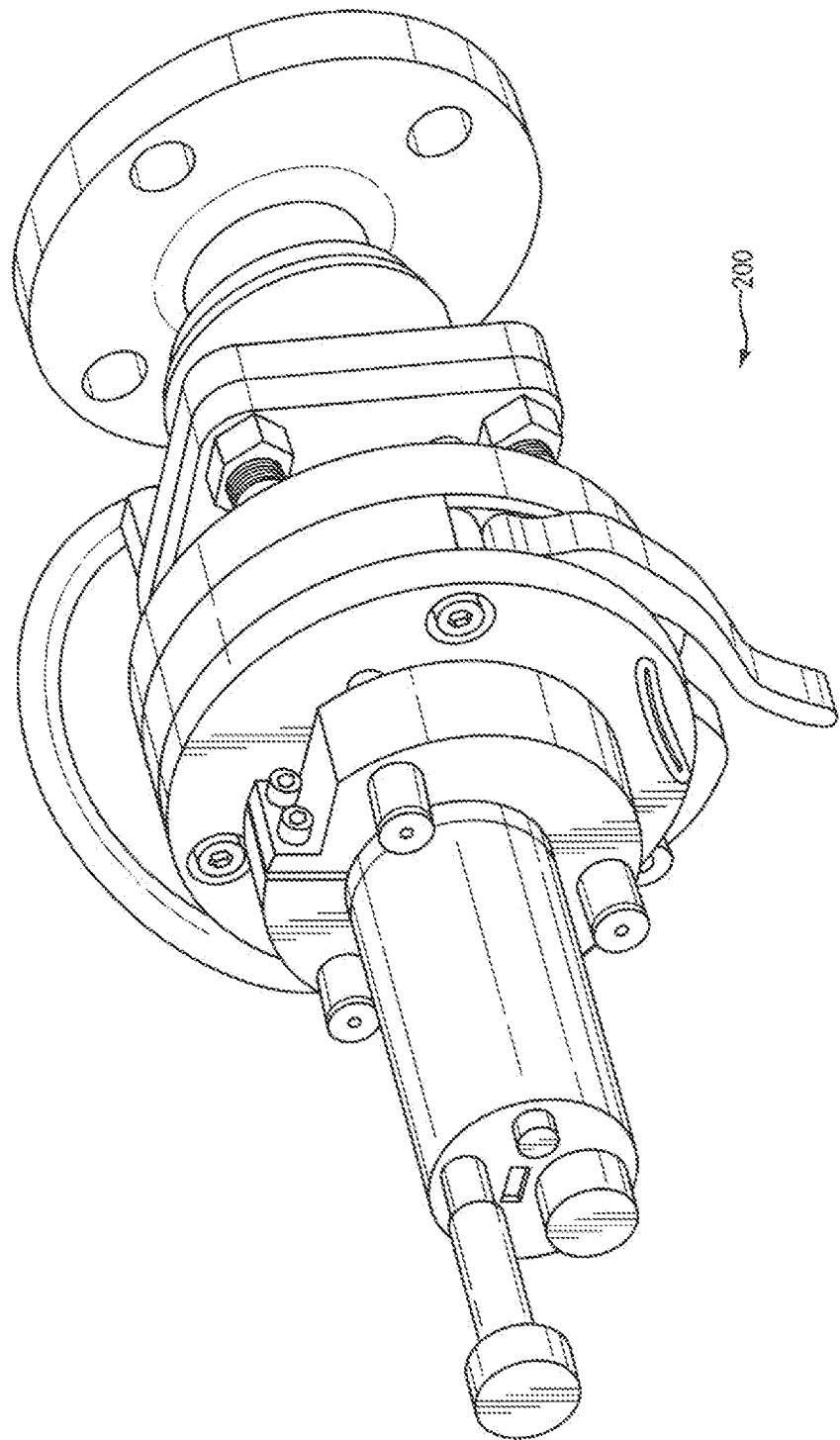

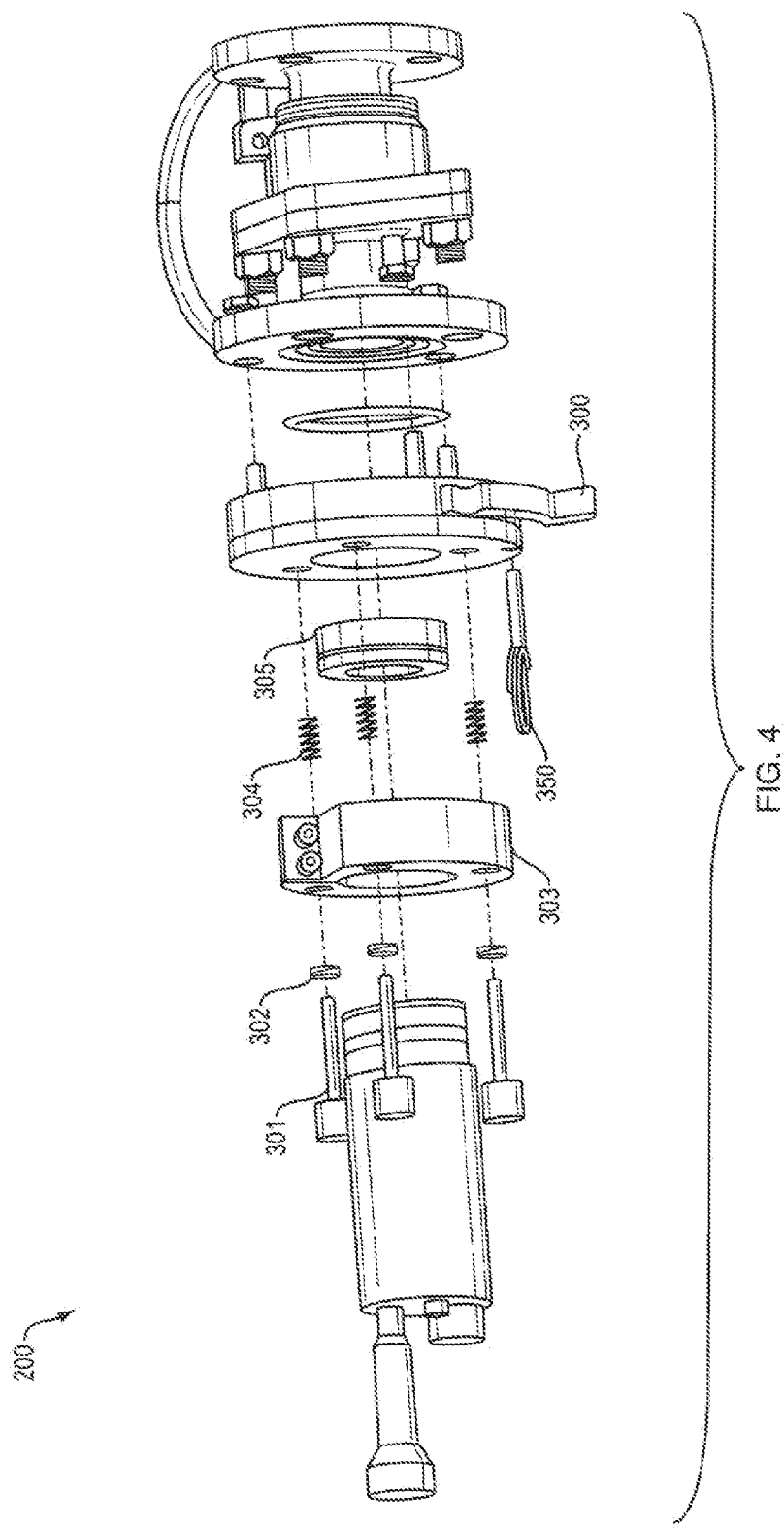

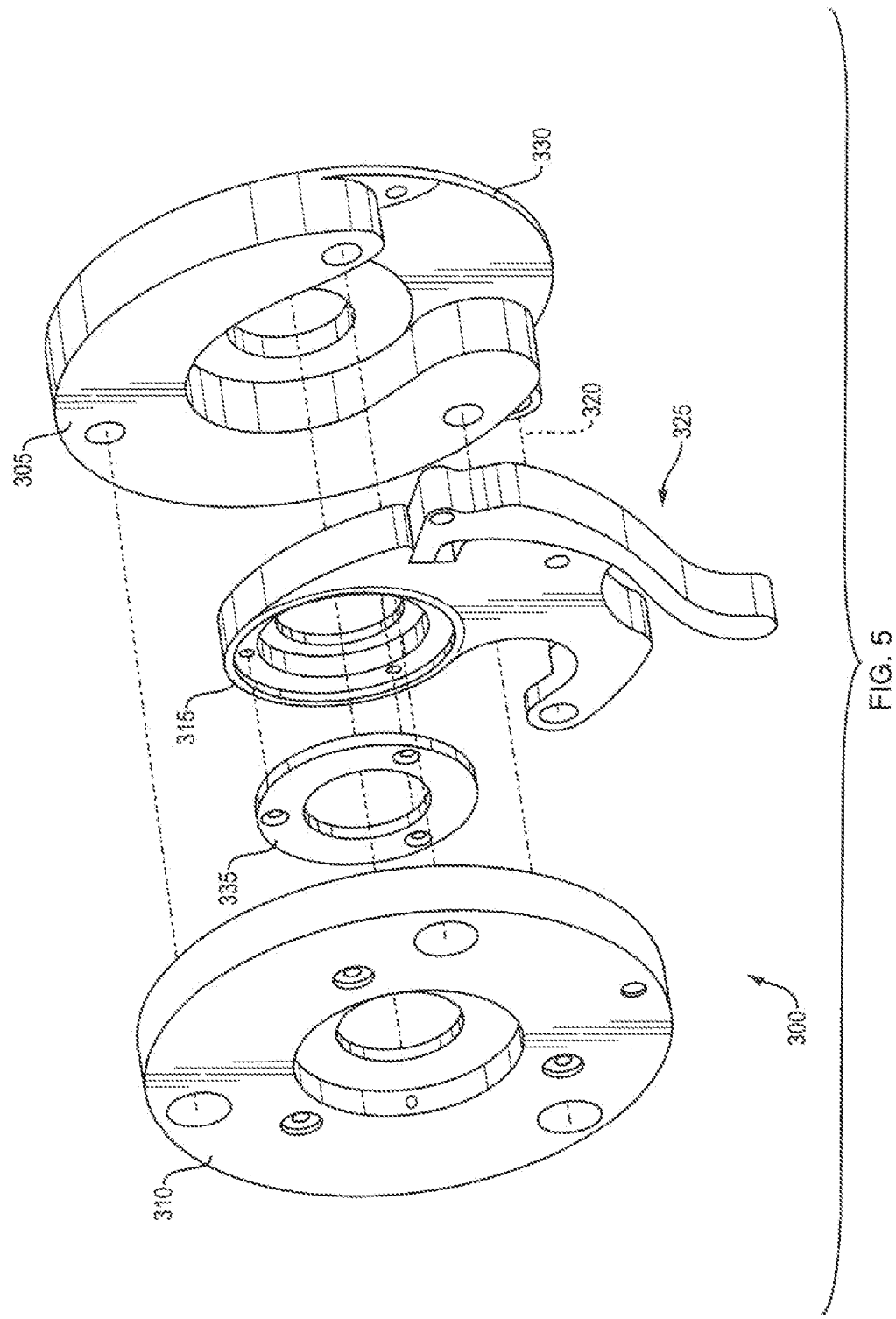

VIEW A-A

VIEW B-B

ADJUSTABLE PYROMETER MOUNT WITH REMOVABLE VIEWPORT MECHANISM

CROSS-REFERENCE TO RELATED APPLICATIONS

The present application claims the benefit of U.S. Patent Application No. 61/884,475 filed Sep. 30, 2013, which is incorporated herein by reference.

TECHNICAL FIELD

The present disclosure relates generally to crystalline material growth systems, and, more particularly, to an adjustable pyrometer mount with a removable viewport mechanism.

BACKGROUND

Crystal growth apparatuses or furnaces, such as directional solidification systems (DSS), Czochralski (CZ) method furnaces, and heat exchanger method (HEM) furnaces, involve the melting and controlled resolidification of a feedstock material, such as silicon or sapphire, in a crucible to produce an ingot or boule. Production of a solidified ingot from molten feedstock occurs in several identifiable steps over many hours. For example, to produce a silicon ingot by the DSS method, solid silicon feedstock is provided in a crucible, often contained in a graphite crucible box, and placed into the hot zone of a DSS furnace. Alternatively, to produce an ingot, such as a sapphire ingot, by the HEM method, solid feedstock, such as alumina, is provided in a crucible containing a monocrystalline seed (which comprises the same material as the feedstock but with a single crystal orientation throughout) placed into the hot zone of a solidification furnace. A heat exchanger, such as a helium-cooled heat exchanger, is positioned in thermal communication with the crucible bottom and with the monocrystalline seed.

The feedstock in either method is then heated to form a liquid feedstock melt (without substantially melting the monocrystalline seed in the HEM method), and the furnace temperature, which is well above the seed melting temperature (e.g., 1412° C. for silicon), is maintained for several hours to ensure proper melting. Once melted, heat is then removed from the melted feedstock, often by applying a temperature gradient in the hot zone, in order to directionally solidify the melt (e.g., from the unmelted seed) to form an ingot. By controlling how the melt solidifies, an ingot having greater purity than the starting feedstock material can be achieved, and in the case of the HEM method a crystalline material having a crystal orientation corresponding to that of the monocrystalline seed can be achieved, which can each then be used in a variety of high end applications, such as in the semiconductor and photovoltaic industries.

During heating and cooling, various instruments may be used to monitor the process in order to ensure proper operation and to allow for any necessary adjustments. In particular, since temperature is a fundamental parameter in many types of furnace operations, where reliable and continuous measurement of the temperature is essential for effective control of the operation, one such device used in furnaces is a pyrometer. A pyrometer is a type of thermometer used to measure typically high temperatures (e.g., using thermal radiation to determine the temperature of an object's surface). For example, in a crystal growth apparatus or furnace, a pyrometer may rely on detecting differences in emissivity between solid and liquid feedstock. Generally, since a heated object gives off electromagnetic radiation, there are two common types of pyrometers: the optical pyrometer (color-based) and the radiation pyrometer (infrared and/or visible light-based).

Notably, both types of pyrometers require visibility to the heated object during the process, and are thus typically mounted to the side of a furnace with a desired vantage point through a viewport. One challenge associated with this arrangement, however, is that current pyrometer mounting assemblies require complete disassembly in order to clean windows to the viewports. Cleaning of the windows is generally required prior to every run for each port (that is, there may be a plurality of ports). Also, particularly for side pyrometers, the windows may also require cleaning during certain stages of the run. This disassembly requirement potentially compromises accuracy and repeatability of the pyrometer readings.

SUMMARY

According to the disclosed embodiments, an illustrative apparatus that is configured to attach to a viewport of a container (e.g., an adjustable pyrometer mount with a removable viewport mechanism) comprises a first plate having a first aperture and a second plate having a second aperture, where the second plate is attached to the first plate such that the first and second apertures are substantially aligned, and where the first and second plates, when attached, define a cavity from an outer edge of the first and second plates to the substantially aligned apertures. A window containment arm may then be pivotally affixed to at least the first plate and configured to substantially fit and pivot into and out of the cavity, and a window contained within the window containment arm is positioned such that the window substantially aligns with the first and second apertures when the window containment arm is fully pivoted into the cavity, and such that the window is accessibly located outside of the cavity when the window containment arm is pivoted out of the cavity.

Accordingly, a user may then extract the window containment arm out of the cavity, perform maintenance to the window while the window containment arm is extracted (e.g., clean, replace, etc.), and then retract the window containment arm into the cavity upon completion of the maintenance to the window.

BRIEF DESCRIPTION OF THE DRAWINGS

The foregoing and other objects, features, aspects and advantages of the embodiments disclosed herein will become more apparent from the following detailed description when taken in conjunction with the following accompanying drawings.

FIGS. 3A-3C illustrate an example of the pyrometer in a front, side, and isometric view, respectively;

FIG. 4 illustrates an example expanded view of the pyrometer;

FIG. 5 illustrates an example expanded view of a window extraction mechanism;

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Figure 1:
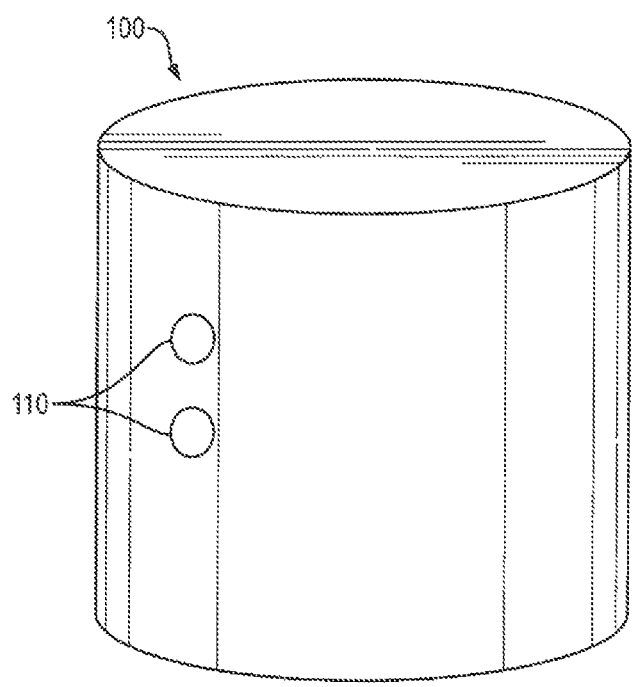
FIG. 1 illustrates an example container with viewports (e.g., a furnace)

FIG. 1 illustrates an example container 100 with one or more viewports 110 allowing visual passage through the walls of the container (e.g., a window or hole/aperture in the walls to provide sight from the outside of the container to the inside of the container. Illustratively, the embodiments herein relate to furnaces as container 100, such as for crystalline material growth systems. However, the embodiments herein are not so limited. Note also that while the container 100 is shown as a generally cylindrical shape, any shaped container (or more specifically, any object comprising a wall with a viewport 110 in it) may be used in accordance with the embodiments herein.

As discussed above, during particular operations within a container (e.g., during heating and cooling operations within a furnace or during chemical reactions, etc.), various instruments may be used to monitor the process in order to ensure proper operation and to allow for any necessary adjustments. In particular, since temperature is a fundamental parameter in many types of furnace operations, where reliable and continuous measurement of the temperature is essential for effective control of the operation, one such device used in furnaces is a pyrometer.

Containers that require visibility to their interior may be configured with one or more viewports 110. One challenge associated with this arrangement, however, is that current mounting assemblies (e.g., pyrometers) require complete disassembly in order to clean viewport windows (e.g., glass, plastic, or other generally transparent and thermally/chemically resistant material). Cleaning of the windows is generally required prior to every run, and may also require cleaning during certain stages of the run. This disassembly requirement potentially compromises accuracy and repeatability of the instrument readings.

Figure 2A:
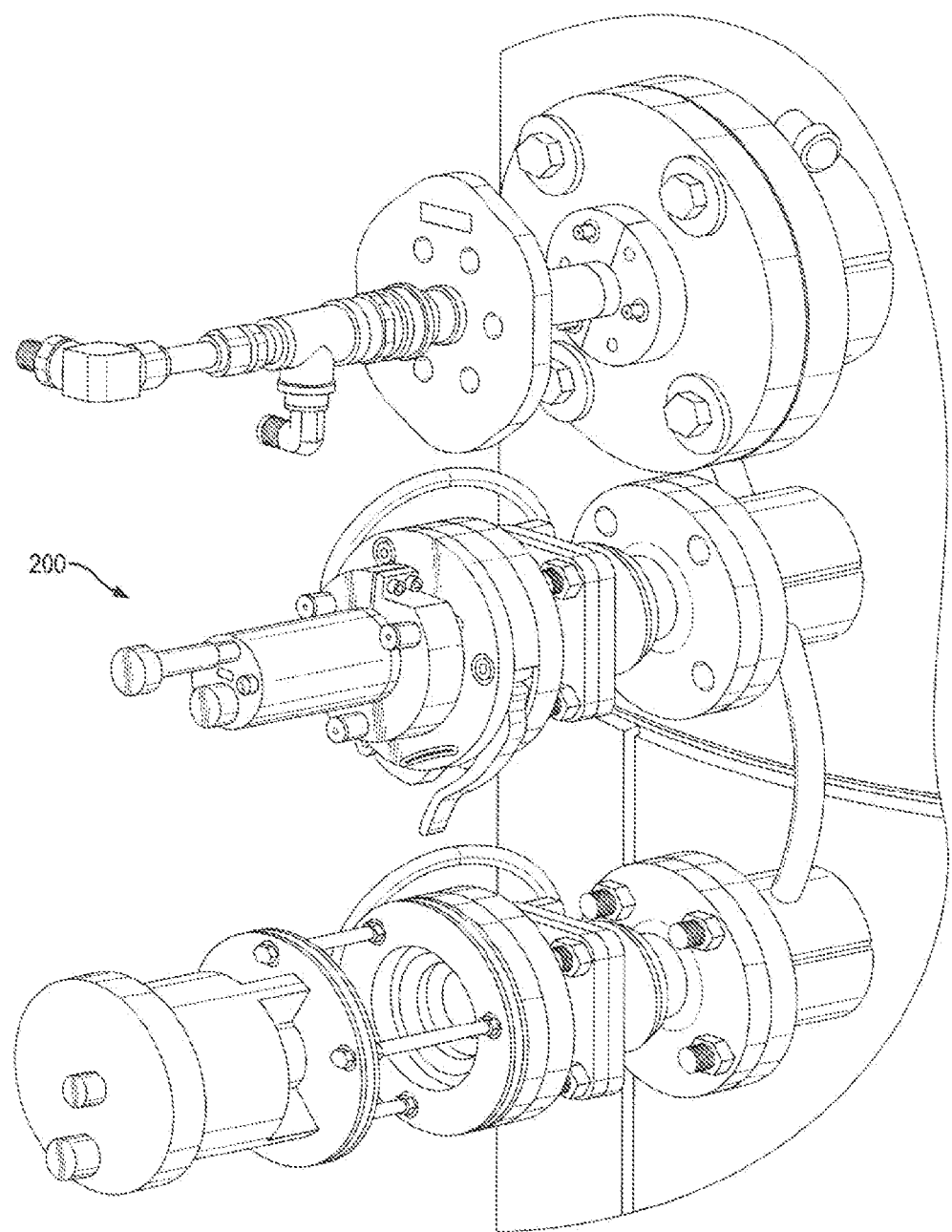
FIGS. 2A-2B illustrate an example pyrometer with an integrated window extraction mechanism in a closed and open position.
Figure 2B:
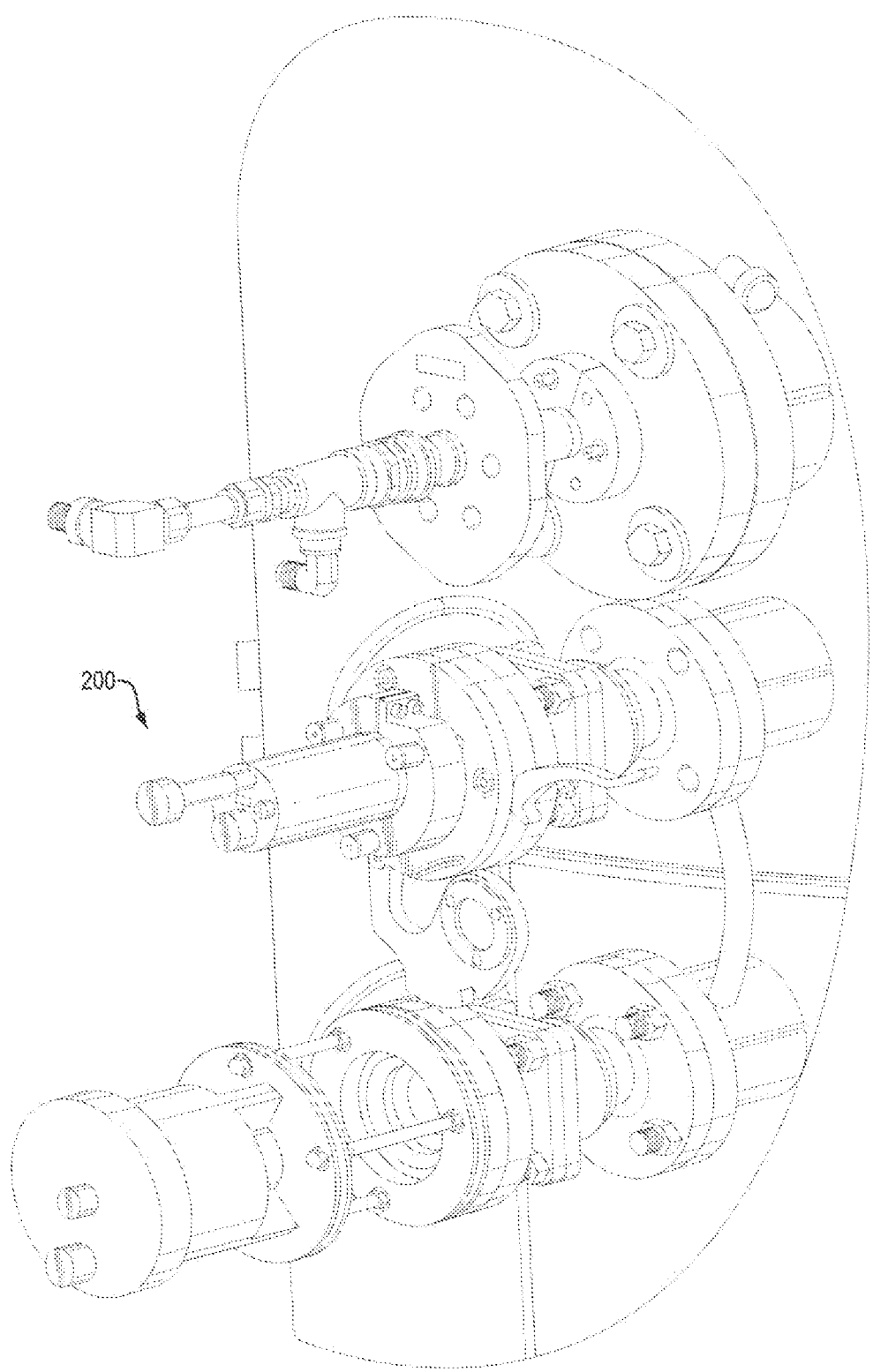
Figure 3A:
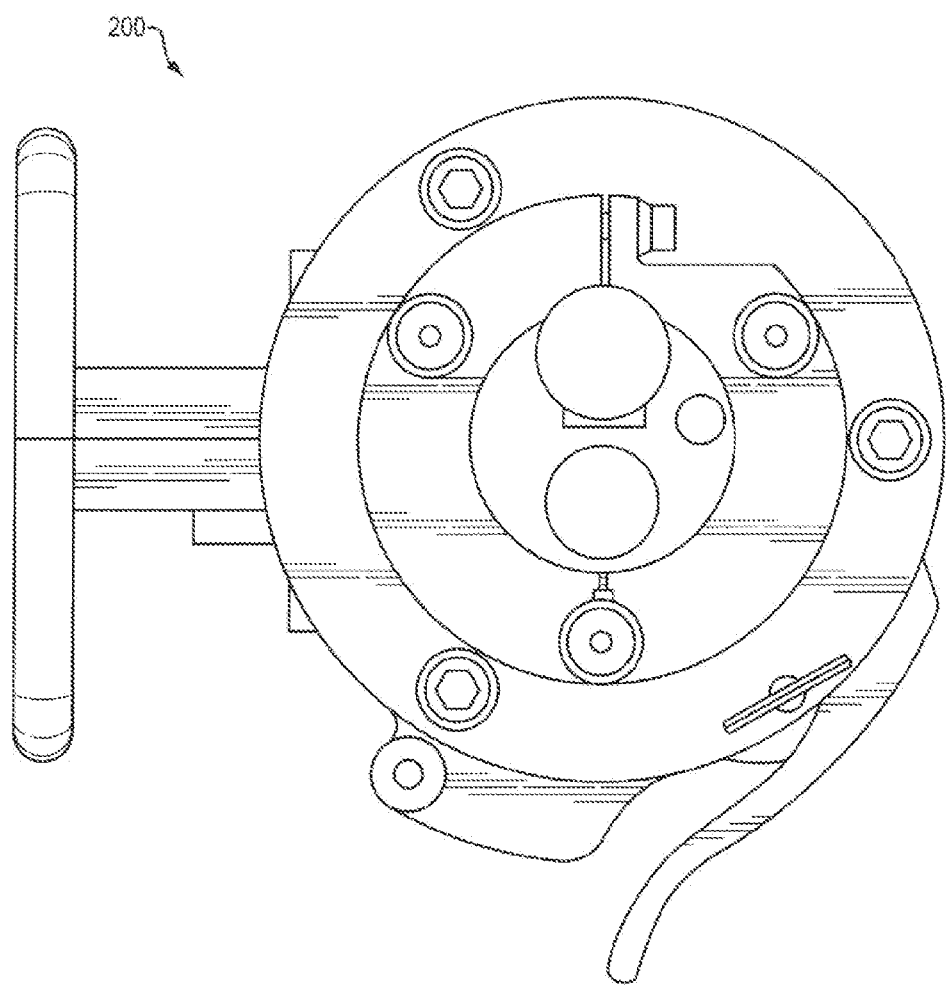
Figure 3B:
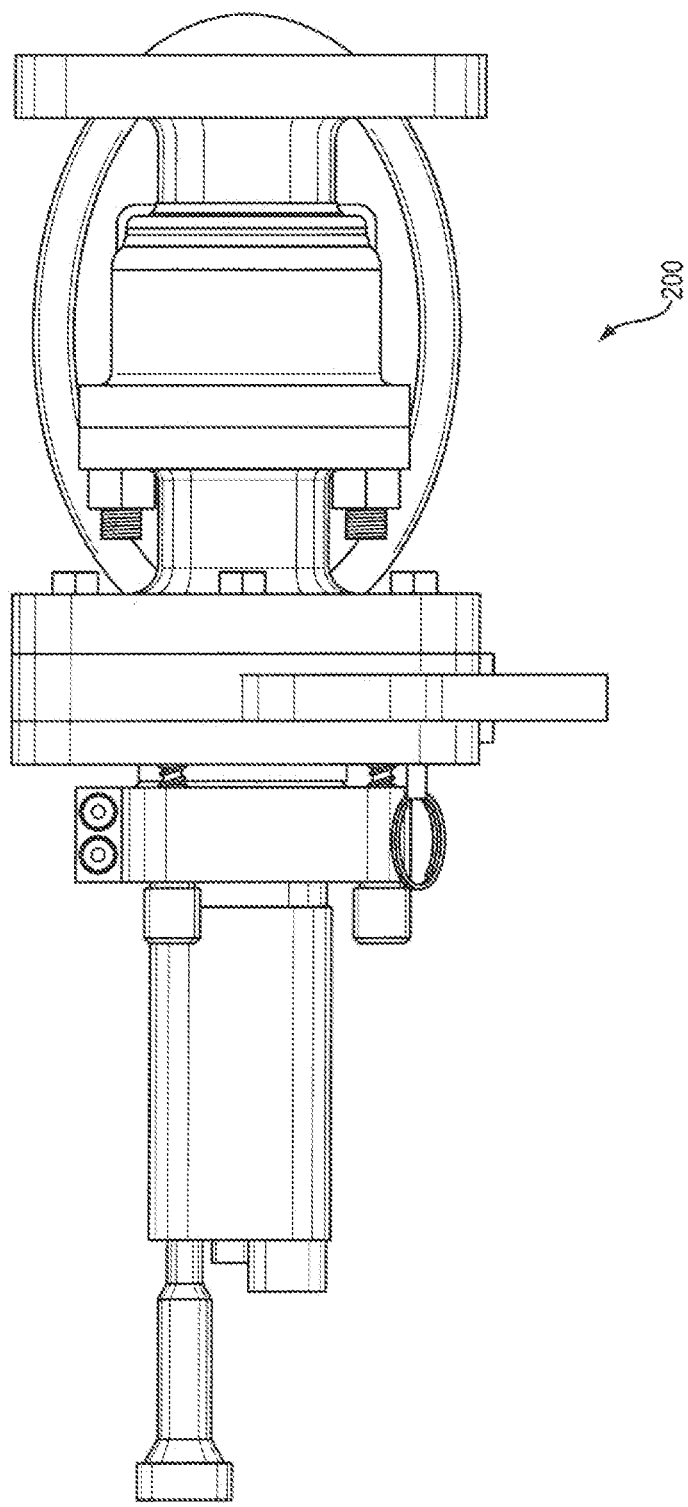

In FIGS. 2A-2B, an example pyrometer 200 may be mounted/attached to the side of a furnace (an example container 100) at one of the viewports 110, along with one or more other instruments, such as gas lines, other types of sensors, and so on. In particular, according to the embodiments herein, and as described in greater detail below, the pyrometer 200 may comprise an integrated window extraction mechanism that when "closed" (FIG. 2A) provides a windowed view from the pyrometer 200 to the viewport 110, and when "open" (FIG. 2B) provides an extracted window containment arm to allow for access to a window for performing associated maintenance, such as cleaning or replacing the window. FIGS. 3A-3C illustrate an example of the pyrometer 200 in a front, side, and isometric view, respectively (with the window containment arm in a closed or retracted position).

In particular, according to one or more of the embodiments herein, FIG. 4 illustrates an example expanded view of the pyrometer 200 showing the window removal/extraction mechanism 300. As indicated, the mechanism 300 may be attached on one side (e.g., the right side in the diagram) to a container mounting component (e.g., sealed with an o-ring), and on an opposing side (e.g., the left side) to a specific pyrometer component. Also, adjustment knobs 301, various washers 302, pyrometer clamp 303, and compression springs 308 may allow orientation adjustment for the pyrometer when attached to the window extraction mechanism 300. Note also that a removable locking pin 350 may be configured to pass through certain portions of the window extraction mechanism 300, as described below.

FIG. 5 illustrates an example expanded view of an illustrative window extraction mechanism 300 in accordance with one or more embodiments described herein. In particular, a mounting plate 305 (e.g., valve mount) may be configured to attach to the container 100 (e.g., directly to a viewport 110 or container mounting components, etc.). Opposite the container mount is a base plate 310, which as mentioned above may be configured to allow positional adjustment of an associated instrument, such as a pyrometer.

Located between the two plates is a window containment arm 315, attached to one or both of the plates at a window containment arm pivot point (axis) 320. In particular, each plate 305 and 310 has a corresponding aperture, which when the plates are attached to each other, are substantially aligned. Also, the two plates 305 and 315 may define a "cavity" from an outer edge of the plates to the substantially aligned apertures. Notably, the shape of each plate 305 and 310 may contribute to the cavity (e.g., each plate creating a portion of the cavity's volume), or else a single plate may provide the entire cavity (e.g., one plate forming the cavity's volume, while the other plate is substantially planar). The window containment arm 315, which is pivotally affixed to one or both of the plates, is configured to substantially fit and pivot into and out of this cavity. As shown in FIG. 5, the window containment arm 315 generally matches the shape of the cavity, and comprises a curved outer edge to allow for pivotal engagement into and out of the cavity. It should be noted, however, that other shapes may be used, and that the embodiments herein are not limited to those explicitly shown or described herein.

Contained within the window containment arm 315 is a window, which is positioned within the window containment arm such that the window substantially aligns with the two apertures of the attached plates 305 and 310 when the window containment arm is fully pivoted into the cavity. At the same time, the window should also be accessibly located outside of the cavity when the window containment arm is pivoted out of the cavity.

An extraction/retraction lever 325 may also be pivotally affixed to at least one of opposing plates 305 and 310 (e.g., lever pivot axis 330) and is configured to engage the window containment arm 315 to at least partially extract the window containment arm out of the cavity and to at least partially retract the window containment arm into the cavity. When closed, the lever 325 should substantially secure the window containment arm within the cavity.

In addition, in one embodiment, a window restrainer plate 335 may be removably connected to the window containment arm 315 and configured to secure the window within the window containment arm. Illustratively, for example, the restrainer plate 335 may be removed (e.g., with attaching screws, by being threaded into the arm 315, or other attachment mechanism) to allow the window to be inserted, removed, or replaced, accordingly.

Figure 6:
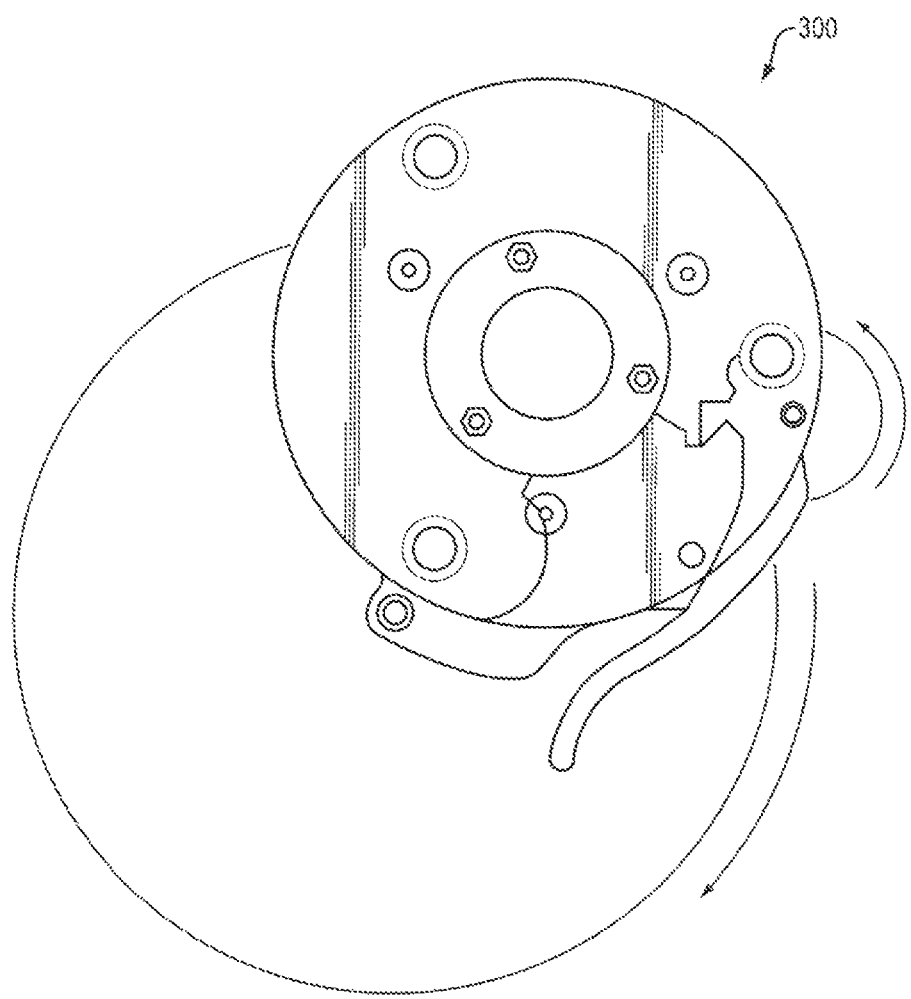
FIG. 6 illustrates an example view of a window extraction mechanism in a closed position.
Figure 7A:
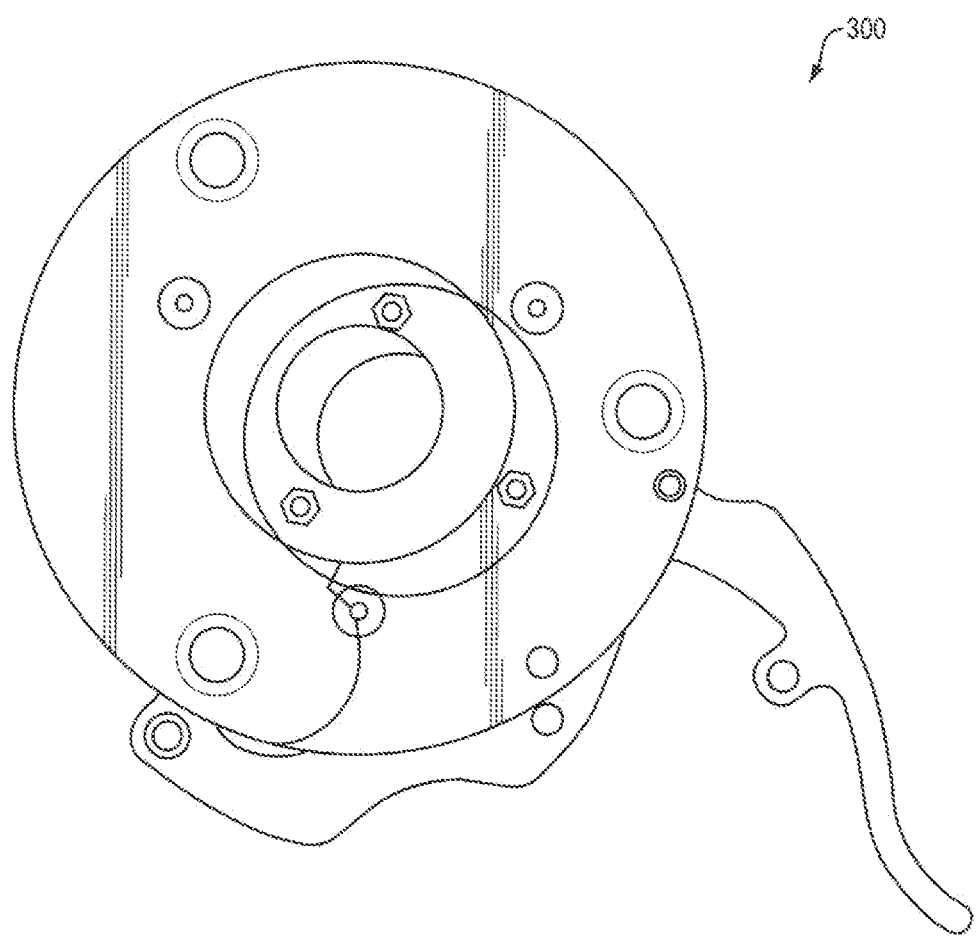
FIG. 7A illustrates an example view of a window extraction mechanism in a partially open (released) position.
Figure 7B:
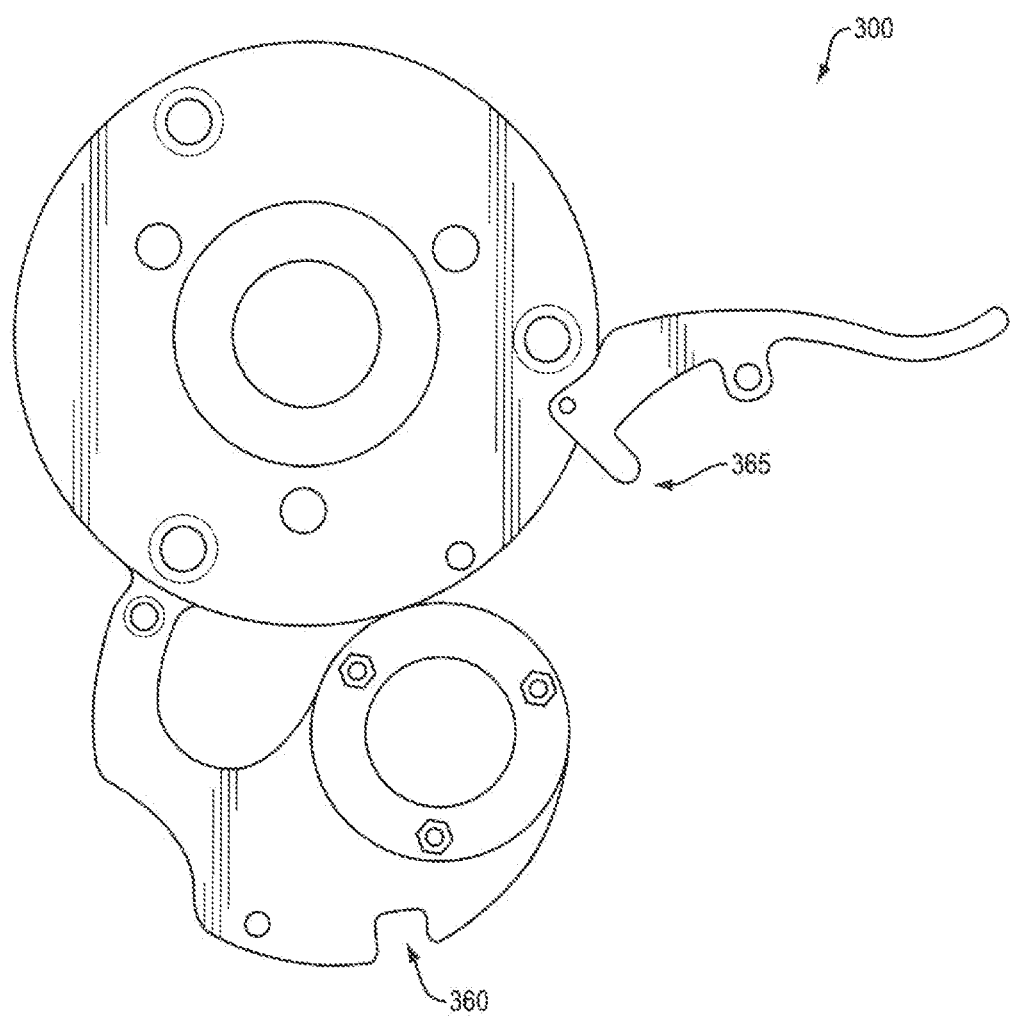
FIG. 7B illustrates an example view of a window extraction mechanism in a fully open position.

Operation of the window extraction mechanism is described further with reference to FIGS. 6-7B. In particular, FIG. 6 illustrates an example view of a window extraction mechanism 300 in a closed position. As shown, the window containment arm 320 and lever 325 each have a respective axis of rotation around a pivot point. In the closed position, the window containment arm 320 places the window in-line with the plate apertures, and the lever 325 locks the arm in place. By pulling on the lever 325 (which may be shaped as shown, or may have any other suitable shape), the point at which the lever contacts the window containment arm may provide sufficient leverage to break any vacuum seal (e.g., FIG. 7A), and slides the window out for cleaning, replacement, and so on (e.g., FIG. 7B). Note that the point of contact, i.e., a point of engagement/disengagement, may comprise a detent 360 defined by the window containment arm 315, and a protrusion 365 defined by the lever. The protrusion is thus configured to engage the detent to provide leverage to at least partially extract the window containment arm out of the cavity and to at least partially retract the window containment arm into the cavity.

Note that the locking pin 350 shown in FIG. 4 above may be configured to be passed through various components of the window extraction mechanism 300 to substantially secure the window containment arm within the cavity when in the closed/retracted position. In particular, the pin 350 may pass through any two components of the mechanism in a manner that prevents movement of the mechanism, such as through either or both of the plates 305 or 310 and through the lever, or else through either or both of the plates 305 or 310 and through the window containment arm, or else either or both of the plates 305 or 310 and through the lever and the window containment arm, or finally merely through the lever and the window containment arm.

Figure 8A:
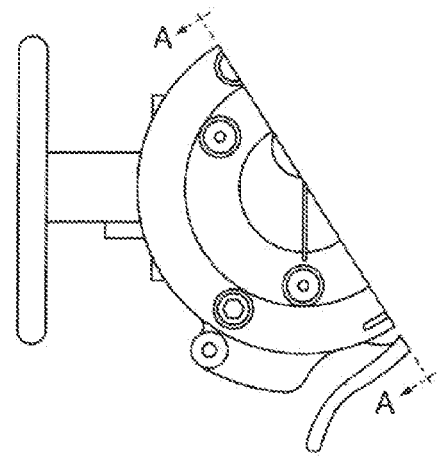
FIGS. 8A-B illustrates an example cross section view of a pyrometer showing an o-ring sealing path overview.
Figure 8B:
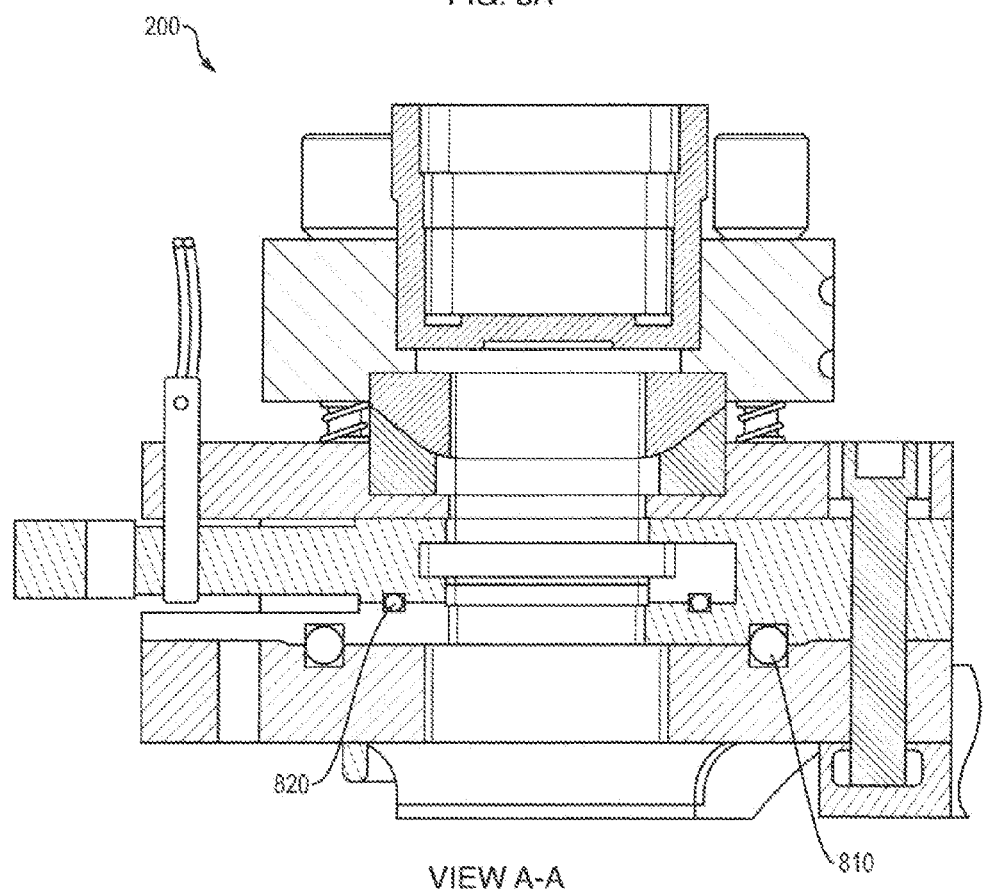

FIGS. 8A-B illustrates an example cross section view of a pyrometer showing an o-ring sealing path overview (cross section A-A). In particular, assuming that the viewport 110 is an opening in the wall of the container 100, certain operations within the container may generally be best kept within the container, such as furnace operations, chemical reactions, etc. As such, the mounting plate 310 may be configured to house a first sealing member (e.g., "o-ring") 810 to maintain a seal around its own aperture and an aperture of the viewport 110 or associated mounting components. In addition, another sealing member (e.g., o-ring) 820 may be disposed within the window containment arm 315 and surrounding the window on a portion/side of the window containment arm facing the viewport of the container, i.e., to contact the mounting plate 305. Note that the mounting plate may have an area relieved to minimize the o-ring 820's contact area until in the proximity of the targeted sealing surface. Said differently, the mounting plate is in contact with the sealing member 820 when the window containment arm is fully pivoted into the cavity, and the mounting plate comprises a relieved portion that minimizes contact between the particular plate and the sealing member when the window containment arm is not fully pivoted into the cavity.

Figure 9A:
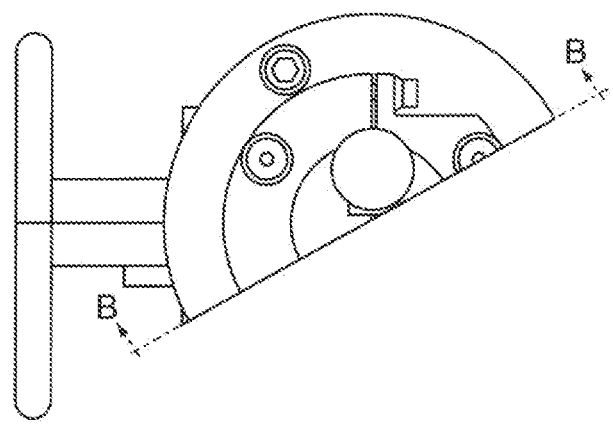
FIGS. 9A-B illustrates an example cross section view of pyrometer adjustment.
Figure 9B:
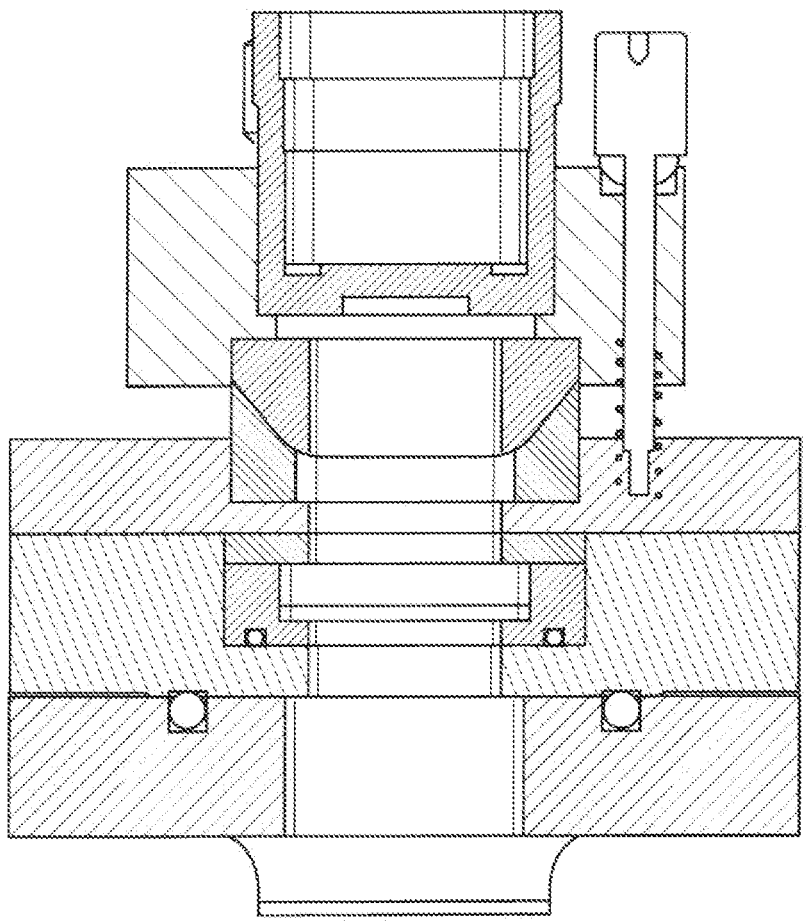

In addition, FIGS. 9A-B illustrates an example cross section view of pyrometer adjustment, through cross section B-B, showing how a spherical washer may be located between the base plate 305, allowing for orientation adjustment (e.g., via adjustment knobs/screws) to allow for proper alignment of the pyrometer (or other instrument) to have visual access through the window extraction mechanism 300 and through the viewport 110 into the container, accordingly.

Figure 10:
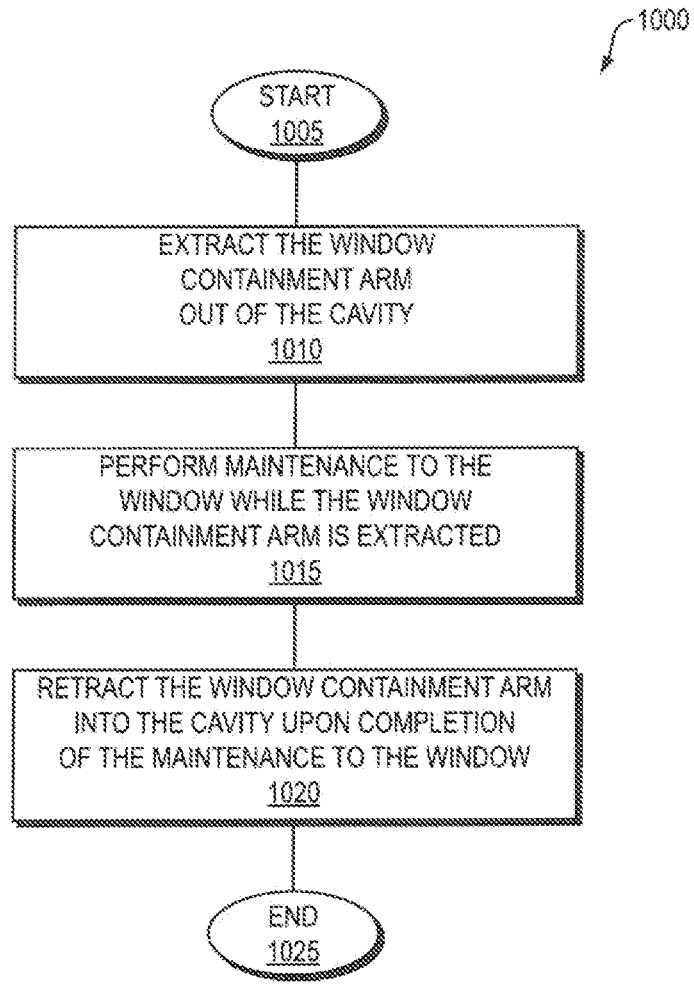
FIG. 10 illustrates an example simplified procedure for use with the window extraction mechanism herein.

FIG. 10 illustrates an example simplified procedure for use with a window extraction mechanism (e.g., an adjustable pyrometer mount with a removable viewport mechanism) as described above with reference to FIGS. 1-9. As shown in FIG. 10, the procedure 1000 may start at step 1005, and continues to step 1010, where, as described in greater detail above, a user (or automated tool) may extract the window containment arm 315 out of the cavity formed by the base plate 310 and/or valve mount plate 305. With the window portion of the arm 315 extracted, then in step 1015 maintenance may be performed to the window, such as either cleaning the window or replacing the window. Accordingly, in step 1020, the window containment arm may be retracted back into the cavity upon completion of the maintenance to the window, and the procedure 1000 ends in step 1025.

It should be understood that the steps shown in FIG. 10 are merely examples for illustration, and certain steps may be included or excluded as desired. For example, the simplified procedure may also be performed with greater specificity, such as using a lever to extract and retract the window containment arm, removing and inserting a locking pin, and so on. Also, other components of operation of the window extraction mechanism, such as adjusting the instruments, may also be performed. Further, while a particular order of the steps is shown, this ordering is merely illustrative, and any suitable arrangement of the steps may be utilized without departing from the scope of the embodiments herein.

The components, arrangements, and techniques described herein, therefore, provide for an adjustable pyrometer mount with a removable viewport mechanism. In particular, the embodiments described herein provide a streamlined pyrometer mounting assembly with an associated viewport window extraction mechanism (removal tool) that eliminates the need to disassemble pyrometers for removal of the viewports. Accordingly, the embodiments herein reduce the potential of negatively impacting the furnace's process by eliminating the potential for inaccurately realigning the pyrometers after cleaning of the viewports. In addition, the embodiments herein also reduce furnace downtime by eliminating the disassembly and reassembly time required prior to each run.

While there have been shown and described illustrative embodiments that provide for an automated heat exchanger alignment means, it is to be understood that various other adaptations and modifications may be made within the spirit and scope of the embodiments herein, with the attainment of some or all of their advantages. Therefore, it is the object of the appended claims to cover all such variations and modifications as come within the true spirit and scope of the embodiments herein.

What is claimed is:

1. An apparatus, comprising:
   a first plate having a first aperture;
   a second plate having a second aperture, the second plate attached to the first plate such that the first and second apertures are substantially aligned, wherein the first and second plates, when attached, define a cavity from an outer edge of at least one of the first or second plates to the substantially aligned apertures, and wherein the first and second plates, as attached, are configured to attach to a viewport of a container;
   a window containment arm pivotally affixed to at least the first plate and configured to substantially fit and pivot into and out of the cavity; and
   a window contained within the window containment arm, wherein the window is positioned the window containment arm such that the window substantially aligns with the first and second apertures when the window containment arm is fully pivoted into the cavity, wherein the window is accessibly located outside of the cavity when the window containment arm is pivoted out of the cavity.

2. The apparatus as in claim 1, further comprising:
   a lever pivotally affixed to at least one of either the first or second plate and configured to engage the window containment arm to at least partially extract the window containment arm out of the cavity and to at least partially retract the window containment arm into the cavity and substantially secure the window containment arm within the cavity.

3. The apparatus as in claim 2, wherein the window containment arm defines a detent, and wherein the lever defines a protrusion configured to engage the detent to provide leverage to at least partially extract the window containment arm out of the cavity and to at least partially retract the window containment arm into the cavity.

4. The apparatus as in claim 2, further comprising:
   a removable locking pin configured to pass through at least one of the first and second plates and the lever when the window containment arm is substantially secured within the cavity.

5. The apparatus as in claim 4, wherein the removable locking pin is further configured to pass through the window containment arm when substantially secured within the cavity.

6. The apparatus as in claim 2, further comprising:
   a removable locking pin configured to pass through the window containment arm and the lever when the window containment arm is substantially secured within the cavity.

7. The apparatus as in claim 1, further comprising:
   a removable locking pin configured to pass through at least one of the first and second plates and the window containment arm when the window containment arm is fully pivoted into the cavity.

8. The apparatus as in claim 1, further comprising:
   a window retainer plate removably connected to the window containment arm and configured to secure the window within the window containment arm.

9. The apparatus as in claim 1, further comprising:
   a sealing member disposed within the window containment arm and surrounding the window on a portion of the window containment arm.

10. The apparatus as in claim 9, wherein a particular plate of either the first or second plate is in contact with the sealing member when the window containment arm is fully pivoted into the cavity, and wherein the particular plate comprises a relieved portion that minimizes contact between the particular plate and the sealing member when the window containment arm is not fully pivoted into the cavity.

11. The apparatus as in claim 1, wherein the container is a furnace.

12. The apparatus as in claim 1, wherein the first and second plates, as attached, are configured to attach, opposite the viewport of a container, to a pyrometer.

13. The apparatus as in claim 12, wherein a particular plate of either the first or second plate is configured to provide orientation adjustment for the pyrometer.

14. A method of using the apparatus as in claim 1, the method comprising:
   extracting the window containment arm out of the cavity;
   performing maintenance to the window while the window containment arm is extracted; and
   retracting the window containment arm into the cavity upon completion of the maintenance to the window.

15. The method as in claim 14, wherein performing maintenance comprises either cleaning the window or replacing the window.

* * * * *